(12) United States Patent
Kim et al.

(10) Patent No.: US 9,664,828 B2
(45) Date of Patent: May 30, 2017

(54) QUANTUM DOT SHEET, AND LIGHT UNIT AND LIQUID CRYSTAL DISPLAY INCLUDING THE SAME

(71) Applicant: Samsung Display Co., Ltd., Yongin, Gyeonggi-Do (KR)

(72) Inventors: Dong Hoon Kim, Suwon-si (KR); Seung Hwan Baek, Seoul (KR); Jin Seo, Osan-si (KR); Myeong-Ju Shin, Seoul (KR); Seung Hwan Chung, Asan-si (KR); Young Jun Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/480,413

(22) Filed: Sep. 8, 2014

(65) Prior Publication Data
US 2015/0286096 A1  Oct. 8, 2015

(30) Foreign Application Priority Data

Apr. 8, 2014 (KR) .................. 10-2014-0041987

(51) Int. Cl.
| | |
|---|---|
| *H01L 33/50* | (2010.01) |
| *G02F 1/1335* | (2006.01) |
| *G02B 5/22* | (2006.01) |
| *B82Y 20/00* | (2011.01) |
| *F21V 8/00* | (2006.01) |

(52) U.S. Cl.
CPC .............. *G02B 5/22* (2013.01); *G02F 1/1336* (2013.01); *H01L 33/504* (2013.01); *B82Y 20/00* (2013.01); *G02B 6/0023* (2013.01); *G02F 1/133615* (2013.01); *G02F 2001/133614* (2013.01); *G02F 2202/36* (2013.01); *Y10S 977/774* (2013.01)

(58) Field of Classification Search
CPC .... H01L 33/50–33/508; G02B 6/0023–6/0031
See application file for complete search history.

(56) References Cited

U.S. PATENT DOCUMENTS

| | | |
|---|---|---|
| 6,753,843 B2 | 6/2004 | Wang |
| 6,869,864 B2 | 3/2005 | Yim et al. |
| 6,930,734 B2 | 8/2005 | Lee |
| 6,992,317 B2 | 1/2006 | Jain et al. |
| 7,022,628 B2 | 4/2006 | Kim et al. |
| 7,147,357 B2 | 12/2006 | Kim et al. |

(Continued)

FOREIGN PATENT DOCUMENTS

| | | |
|---|---|---|
| JP | 2012-155999 | 8/2012 |
| KR | 10-0982992 | 9/2010 |

(Continued)

*Primary Examiner* — Eric Ward
(74) *Attorney, Agent, or Firm* — Innovation Counsel LLP (57) ABSTRACT

According to an exemplary embodiment, the present system and method provide a quantum dot sheet including: a color conversion film that includes quantum dots and a polymer layer in which the quantum dots are dispersed; a first barrier film that is provided one a planar surface of the color conversion film; and a phosphor pattern that has a portion located along an edge portion of the surface of the first barrier film. The phosphor pattern, which may be printed onto the quantum dot sheet, prevents deterioration of the color conversion performance of the quantum dot sheet that may occur due to oxidization.

19 Claims, 4 Drawing Sheets

(56) References Cited

U.S. PATENT DOCUMENTS

| | | |
|---|---|---|
| 7,325,941 B2 | 2/2008 | Kim et al. |
| 7,599,020 B2 | 10/2009 | Yang |
| 7,785,657 B2 | 8/2010 | LoCascio et al. |
| 7,819,539 B2* | 10/2010 | Kim ................. H01L 33/507 313/110 |
| 7,859,175 B2 | 12/2010 | Kurihara et al. |
| 8,193,442 B2 | 6/2012 | Sager et al. |
| 8,517,551 B2* | 8/2013 | Tsukahara ............. B32B 9/00 362/246 |
| 2006/0113895 A1* | 6/2006 | Baroky ................. B82Y 10/00 313/501 |
| 2009/0314991 A1 | 12/2009 | Cho et al. |
| 2010/0051898 A1* | 3/2010 | Kim ..................... C09K 11/02 257/9 |
| 2010/0283072 A1 | 11/2010 | Kazlas et al. |
| 2012/0019123 A1* | 1/2012 | Furukawa ............. H01L 33/54 313/483 |
| 2012/0113672 A1 | 5/2012 | Dubrow et al. |
| 2013/0050612 A1 | 2/2013 | Hur et al. |
| 2013/0062648 A1* | 3/2013 | Nishimura ........... H01L 33/504 257/98 |
| 2013/0094246 A1 | 4/2013 | Kim et al. |
| 2013/0148333 A1 | 6/2013 | Ha et al. |
| 2014/0239332 A1* | 8/2014 | Iwakura ................ H01L 33/50 257/98 |
| 2014/0246689 A1* | 9/2014 | Luo ..................... H01L 33/504 257/98 |
| 2015/0008464 A1* | 1/2015 | Iwakura ............... H01L 33/508 257/98 |
| 2015/0060917 A1* | 3/2015 | Vampola ............. H01L 33/504 257/98 |
| 2015/0129916 A1* | 5/2015 | Bera ..................... H01L 33/504 257/98 |
| 2016/0087171 A1* | 3/2016 | Lopez ................... H01L 33/44 257/98 |

FOREIGN PATENT DOCUMENTS

| | | |
|---|---|---|
| KR | 10-1068866 | 9/2011 |
| KR | 10-2012-0066322 | 6/2012 |
| KR | 10-1156096 | 6/2012 |
| KR | 10-2012-0133062 | 12/2012 |

* cited by examiner

FIG. 5

QUANTUM DOT SHEET, AND LIGHT UNIT AND LIQUID CRYSTAL DISPLAY INCLUDING THE SAME

CROSS-REFERENCE TO RELATED APPLICATION

This application claims priority to and the benefit of Korean Patent Application No. 10-2014-0041987 filed in the Korean Intellectual Property Office on Apr. 8, 2014, the entire contents of which are incorporated herein by reference.

BACKGROUND (a) Field

The present system and method relate to a quantum dot sheet, and a light unit and a liquid crystal display that includes the quantum dot sheet. More particularly, the present system and method relate to a quantum dot sheet in which phosphor is printed onto an edge surface of the quantum dot sheet, and a light unit and a liquid crystal display that includes the quantum dot sheet.

(b) Description of the Related Art

Unlike a self-emissive display device such as a plasma display panel (PDP) or a field emission display (FED), a liquid crystal display (LCD) is a light-receiving display that cannot form an image from self-light emission and, instead, forms an image with light received from an external source. Thus, the liquid crystal display includes a backlight unit (BLU) that emits light to a display panel.

A backlight unit for a liquid crystal display may use a cold cathode fluorescent lamp (CCFL) as a light source. However, when a CCFL is used as a light source, uniformity of luminance and color purity may deteriorate as the size of the liquid crystal display increases.

Alternatively, a backlight unit may use three-color light emitting diodes (LEDs) to realize high color purity in a high-quality display device. However, compared to a backlight unit that uses a CCFL as a light source, a backlight unit that uses three-color LEDs is very expensive.

One way to overcome such a drawback is to use a white LED that converts light emitted from a mono-color LED chip into white light. However, a white color LED has lower color reproducibility and color purity compared to a three-color LED even though a white color LED has higher economic efficiency. Thus, a method for applying semiconductor nanocrystals to a backlight unit has been proposed to improve color reproducibility and color purity and to assure cost competitiveness.

SUMMARY

According to an exemplary embodiment, the present system and method provide a quantum dot sheet that prevents functional deterioration due to oxidization that may otherwise occur at an edge portion of the quantum dot sheet by printing phosphor onto an edge surface of the quantum dot sheet. The present system and method also provide a light unit and a liquid crystal display that includes the quantum dot sheet.

A quantum dot sheet according to an exemplary embodiment of the present system and method includes: a color conversion film that includes quantum dots and a polymer layer in which the quantum dots are dispersed; a first barrier film that is provided on a planar surface of the color conversion film; and a phosphor pattern that has a first portion located along an edge portion of a surface of the first barrier film.

A second barrier film may be provided on a second planar surface of the color conversion film opposite to the first planar surface, and the phosphor pattern may have a second portion located along an edge portion of a surface of the second barrier film.

The first barrier film may include at least one selected from a polyethylene terephthalate (PET) film, a polycarbonate (PC) film, and a co-polyethylene terephthalate (CoPET) film.

The quantum dot sheet and the first barrier film may further include an inorganic oxide, wherein the inorganic oxide may include at least one selected from silica, alumina, titania, and zirconia.

The phosphor pattern may have a third portion that is formed on a side surface of the color conversion film and a side surface of the first and second barrier films.

The first barrier film may have oxygen transmittance of about 0.01 $cm^3 \cdot mm/m^2 \cdot day \cdot atm$ to 0.5 $cm^3 \cdot mm/m^2 \cdot day \cdot atm$ and moisture transmittance of about 0.001 $g/m^2 \cdot day$ to 0.01 $g/m^2 \cdot day$.

The phosphor pattern may include at least one selected from a yellow-based phosphor material, a green-based phosphor material, and a red-based phosphor material.

The phosphor pattern may include a green-based phosphor material and a red-based phosphor material.

The yellow-based phosphor may include at least one selected from a garnet-based phosphor, an oxide-based phosphor, and a nitride-based phosphor, and the garnet-based phosphor may be $(Y,Gd)_3Al_5O_{12}:Ce^{3+}$ or $Tb_3Al_5O_{12}:Ce^{3+}$ which is a yttrium aluminum garnet (YAG) or a terbium aluminum garnet (TAG), the oxide-based phosphor is $(Sr,Ba,Ca,Mg)_2SiO_4:Eu^{2+}$, and the nitride-based phosphor is $La_3Si_6N_{11}:Ce^{3+}$.

The green-based phosphor may include at least one of an oxide-based phosphor, a sulfide-based phosphor, and a nitride-based phosphor, and the oxide-based phosphor may be $(Sr,Ba,Ca,Mg)_2SiO_4:Eu^{2+}$ or $(Sr,Ba,Ca,Mg)_3SiO_5:Eu^{2+}$, the sulfide-based phosphor is $SrGa_2S_4:Eu$, and the nitride-based phosphor is $(\beta\text{-SiAlON}:Eu^{2+})$, $(Sr,Ba)Si_2O_2N_2:Eu^{2+}$, $(Ba,Sr,Ca)_2SiO_4:Eu^{2+}$, or $Ba_3Si_6O_{12}N_2:Eu^{2+}$.

The red-based phosphor may include a nitride-based phosphor selected from $(Sr,Ca)AlSiN_3:Eu^{2+}$ and $(Ba,Sr,Ca)_2Si_5N_8:Eu^{2+}$.

A light unit according to another exemplary embodiment of the present system and method includes: a light emitting diode (LED) light source; a quantum dot sheet provided at a distance from the LED light source, the quantum dot sheet converts light from the LED light source to white light and emits the white light to a liquid crystal panel; and a light guide provided between the LED light source and the quantum dot sheet. The quantum dot sheet may include: a color conversion film that includes quantum dots and a polymer layer in which the quantum dots are dispersed; a first barrier film that is provided on a first planar surface of the color conversion film; and a phosphor pattern that has a portion formed along an edge portion of a surface of the first barrier film.

The quantum dot sheet may include at least two selected from a light guide, a prism sheet, and a luminance enhancement film.

A liquid crystal display according to another exemplary embodiment of the present system and method includes: a liquid crystal display panel that includes an upper polarizer and a lower polarizer respectively attached to an upper portion and a lower portion thereof; and a light unit that provides light to the lower portion of the liquid crystal display panel. The light unit may include: an LED light source; a quantum dot sheet that is provided at a distance from the LED light source, the quantum dot sheet converts light from the LED light source to white light and emits the white light to a liquid crystal panel; and a light guide panel provided between the LED light source and the quantum dot sheet. The quantum dot sheet may include a color conversion film that includes quantum dots and a polymer layer in which the quantum dots are dispersed, a barrier film provided on a planar surface of the color conversion film, and a phosphor pattern formed along an edge portion of a surface of the barrier film.

DETAILED DESCRIPTION OF THE EMBODIMENTS

The present system and method is described more fully hereinafter with reference to the accompanying drawings, in which exemplary embodiments of the system and method are shown. As those skilled in the art would realize, the described embodiments may be modified in various different ways, all without departing from the spirit or scope of the present system and method.

In the drawings, the thickness of layers, films, panels, regions, etc., are exaggerated for clarity and may not be drawn to scale. Like reference numerals designate like elements throughout the specification. It is understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
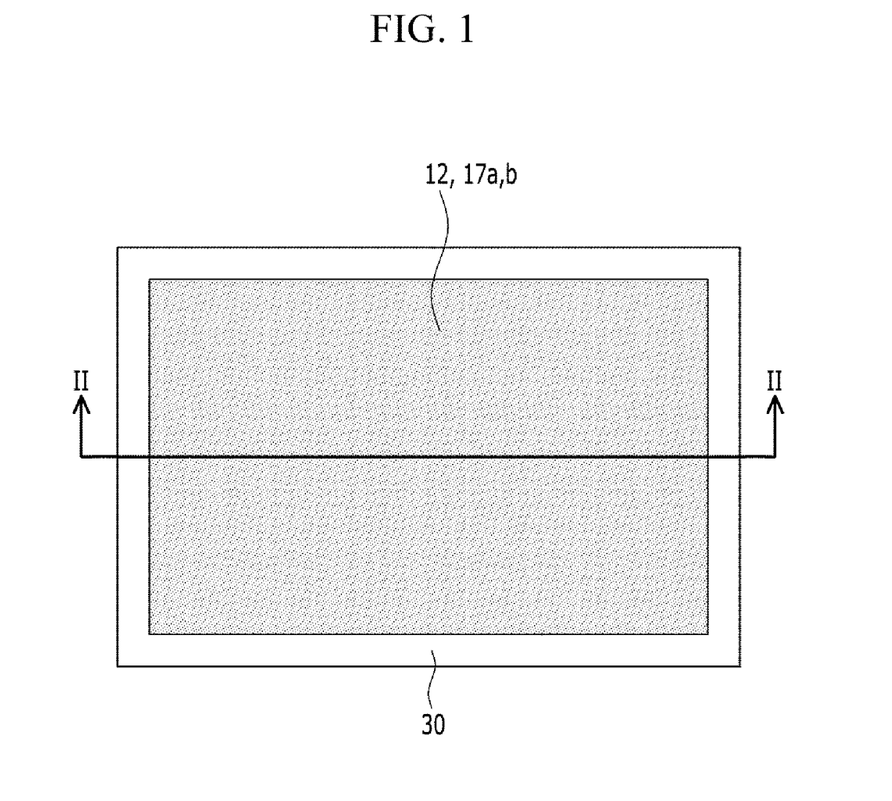
FIG. 1 is a top plan view of a quantum dot sheet according to an exemplary embodiment of the present system and method.
Figure 2:
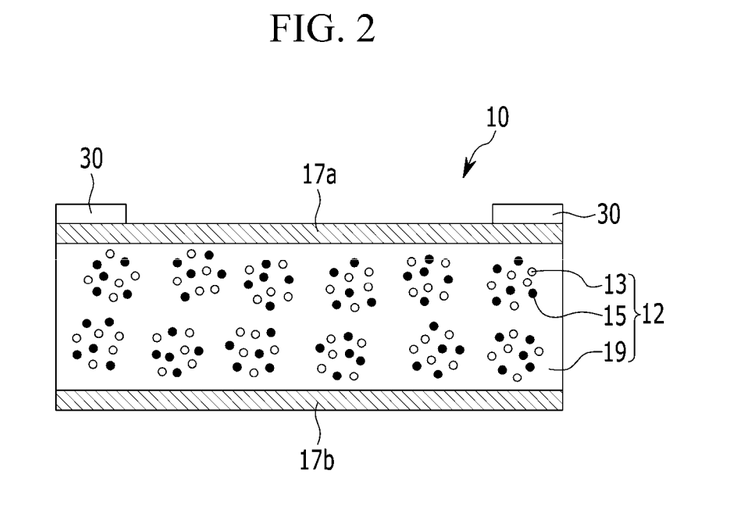
FIG. 2 is a cross-sectional view of FIG. 1, taken along the line II-II'.

FIG. 1 is a top plan view of a quantum dot sheet according to an exemplary embodiment of the present system and method, and FIG. 2 is a cross-sectional view of FIG. 1, taken along the line II-II. Referring to FIG. 1 and FIG. 2, a quantum dot sheet 10 includes a color conversion film 12 that includes a polymer layer 19 in which red quantum dots 13 and green quantum dots 15 are dispersed. The polymer layer 19 is formed from a plastic resin that may include various materials forming a polymer or a film, but is not limited thereto. In an exemplary embodiment, any plastic resin that transmits light in a cured state may be used.

The quantum dots 13 and 15 that realize color reproducibility and color purity are dispersed in the polymer layer 19 of the color conversion film 12. The quantum dots 13 and 15 may be selected from a compound of group II-VI elements, a compound of group IV-VI elements, a group IV element, a compound of group IV elements, and a combination thereof.

The compound of group II-VI elements may be selected from a group consisting of: a two-element compound consisting of CdSe, CdTe, ZnS, ZnSe, ZnTe, ZnO, HgS, HgSe, HgTe, MgSe, MgS, and a mixture thereof; a three-element compound consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The compound of group III-V elements may be selected from a group consisting of: a two-element compound consisting of GaN, GaP, GaAs, GaSb, AlN, AlP, AlAs, AlSb, InN, InP, InAs, InSb, and a mixture thereof; a three-element compound consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a four-element compound consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The compound of group IV-VI elements may be selected from a group consisting of: a two-element compound consisting of SnS, SnSe, SnTe, PbS, PbSe, PbTe, and a mixture thereof; a three-element compound consisting of SnSeS, SnSeTe, SnSTe, PbSeS, PbSeTe, PbSTe, SnPbS, SnPbSe, SnPbTe, and a mixture thereof; and a four-element compound consisting of SnPbSSe, SnPbSeTe, SnPbSTe, and a mixture thereof. The group IV element may be selected from a group consisting of Si, Ge, and a mixture thereof. The compound of group IV elements may be a two-element compound selected from a group consisting of SiC, SiGe, and a mixture thereof.

The two-element compound, the three-element compound, or the four-element compound may exist in particles with uniform or different concentrations. In an exemplary embodiment, the quantum dots may have a core-shell structure in which one of quantum dots 13 and 15 surrounds other quantum dots 13 and 15. A concentration gradient may exist between the core and the shell such that a concentration of elements existing in the shell gradually decreases.

The quantum dots 13 and 15 may have a full width at half maximum (FWHM) of a light emission wavelength spectrum of about less than 45 nm, less than 40 nm, or less than 30 nm. The color purity or color reproducibility of the quantum dot sheet 10 varies depending on the wavelength spectrum. For example, the color purity or color reproducibility may improve as the wavelength spectrum decreases. The quantum dots 13 and 15 may have various shapes, including but not limited to, a sphere, a pyramid, a multi-arm, a cubical nano-particle, a nano-tube, a nano-wire, a nano-fiber, a nano-plate particle, and the like.

Although it is illustrated in FIG. 2 that the color conversion film 12 includes a mixture of the red quantum dots 13 and the green quantum dots 15, the color conversion film 12 may be formed from a first layer that includes the red quantum dots 13 and a second layer that includes the green quantum dots 15. The color conversion film 12 may further include an inorganic oxide that acts as a light diffuser material. The inorganic oxide may be selected from silica, alumina, titania, zirconia, and a combination thereof.

The quantum dot sheet 10 may further include barrier films 17a and 17b that are provided on the top and bottom surfaces of the color conversion film 12. Although two barrier films 17a and 17b are formed in FIG. 2, it is contemplated that a barrier film may be formed on only one surface and not both surfaces of the color conversion film 12. The barrier films 17a and 17b may be formed from at least one of polyethylene terephthalate (PET) film, polycarbonate (PC), and co-polyethylene terephthalate (CoPET). The barrier films 17a and 17b may further include an inorganic oxide that acts as a light diffuser material. The inorganic oxide may be selected from silica, alumina, titania, zirconia, and a combination thereof.

In addition, the barrier films 17a and 17b may have protrusions and depressions on a surface that does not contact the color conversion film 12. The protrusions and depressions formed on the surface diffuse the light emitted from the LED light source.

In an exemplary embodiment, the barrier films 17a and 17b may have an oxygen transmittance of about 0.01 $cm^3 \cdot mm/m^2 \cdot day \cdot atm$ to 0.5 $cm^3 \cdot mm/m^2 \cdot day \cdot atm$ and moisture transmittance of about 0.001 $g/m^2 \cdot day$ to 0.01 $g/m^2 \cdot day$. Having such an oxygen transmittance and a moisture transmittance in these ranges stably preserves the quantum dots 12 and 15 against the external environment.

Although it is not illustrated in FIG. 2, an adhesive layer may be further included between the color conversion film 12 and the barrier films 17a and 17b. If the barrier films 17a and 17b are adhesive members, the adhesive layer may be omitted.

In addition, a protective film (not shown) having transmittance may be further provided on an external surface of the quantum dot sheet 10, that is, on a surface of the barrier films 17a and 17b that does not contact the color conversion film 12. The protective film may be formed from a release film made of a polyester such as polyethylene terephthalate.

As shown in FIG. 2, because the barrier films 17a and 17b are formed on the top and bottom surfaces of the color conversion film 12, the side surfaces of the color conversion film 12 may not be preserved by the barrier films 17a and 17b. Thus, a side edge of the color conversion film 12 may oxidize due to moisture and oxygen existing in the external environment, and thereby, cause the quantum dot sheet 10 to malfunction at the oxidized side edge of the color conversion film 12. When this happens, an original color of the LED source may directly leak to the outside where it can be perceived, which may be undesirable.

To counteract the effects of oxidation at the side edges of the color conversion film 12, the quantum dot sheet 10 of the exemplary embodiment in FIG. 2 includes a phosphor pattern 30 formed on an edge portion of a surface of the barrier films 17a and 17b. When the phosphor pattern 30 is provided on the edge portion of the color conversion film 12 where oxidization may occur in the quantum dot sheet 10, the phosphor pattern 30 performs a light conversion function such that even if oxidization occurs in the color conversion film 12, the performance of the quantum dot sheet 10 does not deteriorate. Specifically, the phosphor pattern converts leaked color light from the light source into white light.

The phosphor pattern 30 may be printed onto the surface of the quantum dot sheet 10 (e.g., top surface of the barrier film 17a as shown in FIG. 2) at the edges, and may be made of at least one of a yellow-based phosphor material, a green-based phosphor material, and a red-based phosphor material. The yellow-based phosphor may include at least one of a garnet-based phosphor, an oxide-based phosphor, and a nitride-based phosphor. A composition of $(Y,Gd)_3Al_5O_{12}:Ce^{3+}$, which is a yttrium aluminum garnet (YAG) and a terbium aluminum garnet (TAG), $Tb_3Al_5O_{12}:Ce^{3+}$, $(Sr,Ba,Ca,Mg)_2SiO_4:Eu^{2+}$ phosphor, which is an oxide phosphor, and $La_3Si_6N_{11}:Ce^{3+}$ phosphor, which is a nitride phosphor, may be used alone or as a mixture thereof as the garnet phosphor.

The green-based phosphor may include at least one of an oxide-based phosphor, a sulfide-based phosphor, and a nitride-based phosphor. The oxide-based green phosphor may include one of a silicate-based phosphor such as $(Sr,Ba,Ca,Mg)_2SiO_4:Eu^{2+}$ having a composition of $M_2SiO_4$ or $(Sr,Ba,Ca,Mg)_3SiO_5:Eu^{2+}$ having a composition of $M_3SiO_5$, a sulfide-based phosphor having a composition of $SrGa_2S_4:Eu$, or a nitride-based phosphor having a composition of beta-SiAlON. The nitride-based green phosphor may include a nitride hired during the EU having a crystal structure of $\beta$-$Si_3N_4$ crystal and/or oxynitride crystal ($\beta$-SiAlON:$Eu^{2+}$). The nitride-based phosphor may include a phosphor of $(Sr,Ba)Si_2O_2N_2:Eu^{2+}$, $(Ba,Sr,Ca)_2SiO_4:Eu^{2+}$, or $Ba_3Si_6O_{12}N_2:Eu^{2+}$.

The red-based phosphor may include at least one of nitride-based phosphors, and may use at least one selected from $(Sr,Ca)AlSiN_3:Eu^{2+}$ and $(Ba,Sr,Ca)_2Si_5N_8:Eu^{2+}$.

Figure 3:
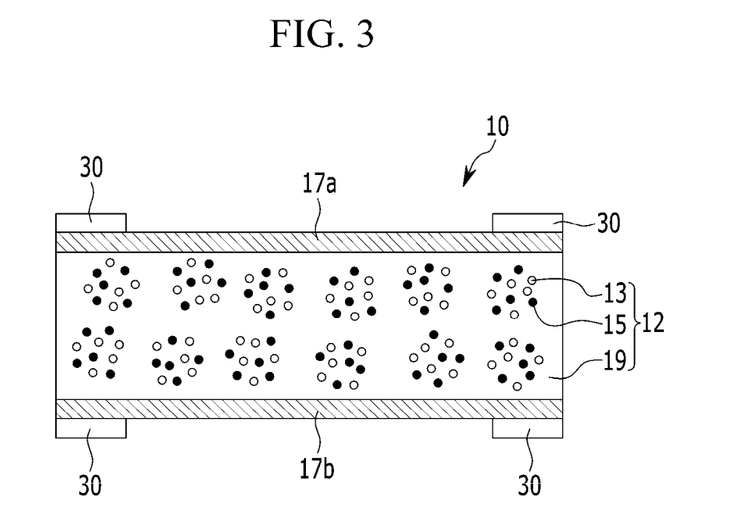
FIG. 3 is a cross-sectional view of a quantum dot sheet according to another exemplary embodiment of the present system and method.

FIG. 3 is a cross-sectional view of a quantum dot sheet according to another exemplary embodiment of the present system and method. The embodiment of FIG. 3 differs from that of FIG. 2 at least in that a phosphor pattern 30 is formed on the edge portion of both the top and bottom surfaces of the quantum dot sheet 10 (e.g., on edge portion of the surfaces of the barrier films 17a and 17b).

Figure 4:
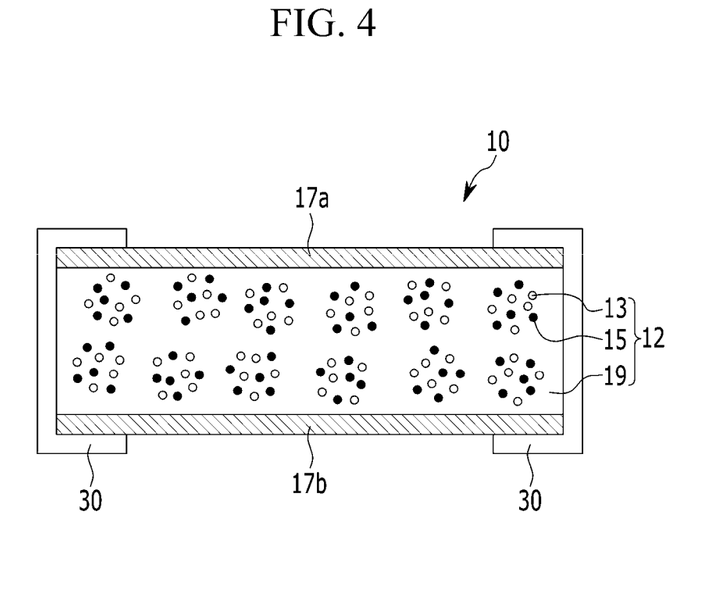
FIG. 4 is a cross-sectional view of a quantum dot sheet according to another exemplary embodiment of the present system and method.

FIG. 4 is a cross-sectional view of a quantum dot sheet according to another exemplary embodiment of the present system and method. The exemplary embodiment of FIG. 4 differs from that of FIG. 3 at least in that a phosphor pattern 30 is formed on the edge portion of the top and bottom surfaces of the quantum dot sheet 10 (e.g., on edge portion of the surfaces of barrier films 17a and 17b) and on one or more side surfaces of the quantum dot sheet 10.

Hereinafter, a liquid crystal display including the quantum dot sheet 10 according to an exemplary embodiment of the present system and method is described.

Figure 5:
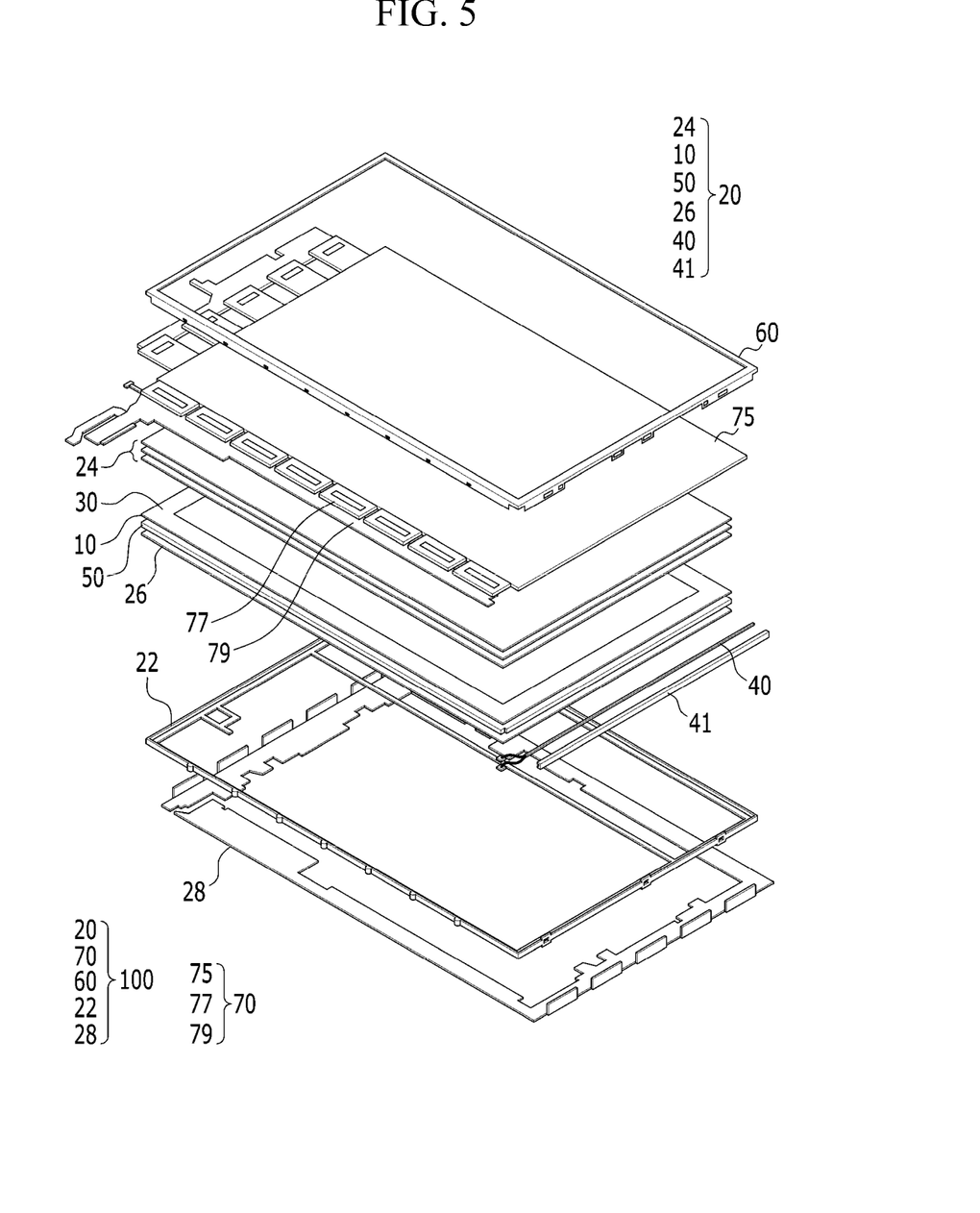
FIG. 5 is a perspective view of a liquid crystal display according to an exemplary embodiment of the present system and method.

FIG. 5 is a perspective view of a liquid crystal display according to an exemplary embodiment of the present system and method. The liquid crystal display 100 includes a light unit 20 that supplies light to a liquid crystal display panel assembly 70 when displaying an image. By controlling the light supplied from the light unit 20, the liquid crystal panel assembly is able to display various shades of gray in the image. The liquid crystal display 100 also includes a top chassis 60, a molded frame 22, and a bottom chassis 28 that supports the light unit 20 and the liquid crystal panel assembly 70 in a fixed manner.

The liquid crystal panel assembly 70 includes a liquid crystal panel 75, an integrated circuit (IC) chip 77, and a flexible printed circuit board (FPCB) 79. The liquid crystal panel 75 may be include a thin film transistor (TFT) substrate that contains a plurality of thin film transistors, an upper substrate provided on top of the thin film transistor substrate, and a liquid crystal layer interposed between the thin film transistor substrate and the upper substrate. The IC chip 77 may be mounted to the TFT substrate and controls the liquid crystal panel 75.

The TFT substrate is a transparent insulation substrate on which a plurality of thin film transistors are formed in a matrix format. A source terminal of each TFT is connected to a data line and a gate terminal thereof is connected to a gate line. In addition, a pixel electrode made of a transparent conductive material, e.g., ITO is connected to a drain terminal of the TFT.

Each of the data lines and gate lines of the liquid crystal panel 75 are connected to the FPCB 79. The FPCB controls the electrical signals that are supplied to the data lines and gate lines, and thus, to the source terminal and the gate terminal of each TFT. Each TFT is turned on or turned off according to a scan signal applied to its gate terminal through the gate line. That is, when a sufficient electric signal (i.e., higher than the transistor's threshold gate voltage) is supplied to the gate line of a TFT and an image signal is supplied to the source terminal through the data line, the image signal is also transmitted to the drain terminal. However, if only the image signal is supplied and not the gate voltage, the image signal is not transmitted to the drain terminal.

The FPCB 79 drives scan signals to the gate lines and image signals to the data lines of the liquid crystal panel 75 based signals received from an external source of the liquid crystal panel 75. The FPCP 79 also controls the timing for applying the image signals and the scan signals at a proper time.

The upper substrate is disposed above the TFT substrate and faces the TFT substrate. The upper substrate includes a matrix of RGB color filters that corresponds to the matrix of TFTs from a plan view and that is formed through a thin film process. A common electrode made of ITO is deposited onto the color filter matrix. When power is applied to the gate terminal and the source terminal of a TFT, thereby turning it on, an electric field is formed between the pixel electrode of the TFT substrate and the common electrode of the upper substrate. The electric field changes the alignment angle of the liquid crystal molecules interposed between the TFT substrate and the upper, and thereby, changes the amount of light being transmitted such that a desired image is displayed.

A polarizer (not shown) is disposed below and above the liquid crystal panel 75 such that the transmissive axis of each polarizer is substantially perpendicular to each other.

Although a structure of a liquid crystal panel 75 according to an exemplary embodiment is described above, various other embodiments are contemplated and within the scope of the present disclosure. For example, in another embodiment, the common electrode or the color filter may be formed in the TFT substrate instead of the upper substrate. Also, a printed circuit board may be further provided such that the printed circuit board and the TFT substrate are connected to each other by the flexible printed circuit board. In addition, light-receiving display panels of various exemplary embodiments may be used.

The light unit 20 that supplies uniform light to the liquid crystal panel 75 is provided below the liquid crystal panel assembly 70 and received on the bottom chassis 28.

The top chassis 60 is provided above the liquid crystal panel assembly 70 to bend the flexible printed circuit board 79 to the outside of the molded frame 22 and to prevent the liquid crystal panel assembly 70 from being released from the bottom chassis 28.

The light unit 20 is provided with at least one light source 40 that is fixed to the molded frame 22 and supplies light to the liquid crystal panel assembly 70, a substrate 41 that supplies power to the light source 40, a light guide 50 that guides light emitted from the light source 40 to the liquid crystal panel assembly 70, a reflection sheet 26 that is provided in the lower side of the light guide 50 to reflect light, an optical sheet 24 that adjusts the luminance characteristic of the light being guided to the liquid crystal panel assembly 70, and a quantum dot sheet 10.

The optical sheet 24 may include at least one of a prism sheet that has a prism structure and a diffuser sheet that uniformly diffuses light. Further, the optical sheet 24 may include a luminance enhancement film, such as a dual brightness enhancement film (DBEF) that reflects a part of the light in the polarization direction and transmits the light in the polarization direction perpendicular thereto to improve the efficiency of light.

The quantum dot sheet 10 may be disposed on and beneath the optical sheet 24, or when a plurality of optical sheets 24 are used, the quantum dot sheet 10 may be disposed between the optical sheets 24.

In the exemplary embodiment of FIG. 5, a light emitting diode (LED) is used as the light source 40. The light emitting diode may be a diode that emits blue light or a diode that emits ultraviolet rays. Alternatively, a diode that emits light of a specific wavelength may be used. When the light source 40 emits light of a specific wavelength instead of emitting white light, a phosphor that changes the light of the specific wavelength to white light may not need to be additionally provided in the light source 40 so that its manufacturing cost can be reduced.

As described, the light source 40 that emits light of a specific wavelength is used as the light source 40 because the quantum dot sheet 10 can amplify or generate light of another wavelength and provide the amplified or generated light to an upper portion of the light unit 20. That is, the quantum dot sheet 10 is disposed at a predetermined distance from the LED light source 40 and functions as a light converting layer that converts light emitted from the LED light source 40 and transmits the converted light to the liquid crystal panel assembly 70.

When the light emitted from the LED light source 40 passes through the quantum dot sheet 10, white light which is a mixture of blue light, green light, and red light can be produced. Here, the ratio of blue light, green light, and red light can be adjusted by modifying the composition and size of the quantum dots forming the quantum dot sheet 10. Accordingly, white light that has excellent color reproducibility and color purity can be achieved.

The quantum dot sheet 10 may be formed from a plurality of layers including a first layer including red quantum dots and a second layer including green quantum dots. The plurality of layers may be disposed on top of each other in an order such that the light emission wavelengths/energies of the quantum gradually increase/decrease toward the LED light source 40. For example, when the LED light source 40 is a blue LED light source, the quantum dot sheet 10 may be formed of a red light conversion layer and a green conversion layer that are sequentially layered in a direction away from the LED light source 40.

A quantum dot sheet 10 according to an exemplary embodiment of the present system includes a phosphor pattern 30 formed at an edge portion of one or more surfaces of the barrier films 17a and 17b. In one exemplary embodiment, the phosphor patterns 30 may be provided only on the top surface or the bottom surface of the quantum dot sheet 10. In another exemplary embodiment, a phosphor pattern 30 may be provided on both the bottom and top surfaces of the quantum dot sheet 10 (i.e., on the surfaces of both barrier films 17a and 17b).

For the embodiment shown in FIG. 5, instead of forming the phosphor pattern 30 on the bottom surface of the quantum dot sheet 10, the phosphor pattern 30 may be formed at an edge portion of the light guide 50 because in either case the phosphor pattern 30 is interposed between the barrier film 17b and the light guide 40 to convert any leaked (e.g., from oxidation of the color conversion film) colored light into white light.

The phosphor pattern 30 may be printed onto the surface of the edge of the quantum dot sheet 10, and may be made of at least one of a yellow-based phosphor material, a green-based phosphor material, and a red-based phosphor material.

The yellow-based phosphor may include at least one of a garnet phosphor, an oxide phosphor, and a nitride phosphor. A composition of $(Y,Gd)_3Al_5O_{12}:Ce^{3+}$, which is a yttrium aluminum Garnet (YAG) and a terbium aluminum garnet (TAG), a $Tb_3Al_5O_{12}:Ce^{3+}$, $(Sr,Ba,Ca,Mg)_2SiO_4:Eu^{2+}$ phosphor, which is an oxide phosphor, and a $La_3Si_6N_{11}:Ce^{3+}$ phosphor, which is a nitride phosphor, may be used alone or as a mixture thereof as the garnet phosphor.

The green-based phosphor may include at least one of an oxide phosphor, a sulfide phosphor, and a nitride phosphor. The oxide-based green phosphor may include one of a silicate-based phosphor such as $(Sr,Ba,Ca,Mg)_2SiO_4:Eu^{2+}$ having a composition of $M_2SiO_4$ or $(Sr,Ba,Ca,Mg)_3SiO_5$: $Eu^{2+}$ having a composition of $M_3SiO_5$, a sulfide-based phosphor having a composition of $SrGa_2S_4$:Eu, or a nitride-based phosphor having a composition of beta-SiAlON. The nitride-based green phosphor may include a nitride hired during the Eu having a crystal structure of $\beta$-$Si_3N_4$ crystal and or oxynitride crystal ($\beta$-SiAlON:$Eu^{2+}$). The oxynitride-based phosphor may include a phosphor of $(Sr,Ba)Si_2O_2N_2$: $Eu^{2+}$, $(Ba,Sr,Ca)_2SiO_4$:Eu2+, $Ba_3Si_6O_{12}N_2$:Eu2+.

The red-based phosphor may include at least one of nitride-based phosphors, and may be at least one selected from $(Sr,Ca)AlSiN_3:Eu^{2+}$ and $(Ba,Sr,Ca)_2Si_5N_8:Eu^{2+}$.

When the phosphor pattern 30 is provided at the edge portion of the color conversion film 12 where oxidization may occur in the quantum dot sheet 10, the phosphor pattern 30 performs a light conversion function even though oxidization occurs in the color conversion film 12 so that performance of the quantum dot sheet 10 does not deteriorate.

Although FIG. 5 depicts the light source 40 as having an edge-type light unit 20 provided at one side of the light guide 50, the light source 40 may instead have a direct-type light unit provided below the quantum dot sheet 10 in another embodiment.

White light emitted from the light unit 20 passes through a polarizer (not shown) and the liquid crystal panel 75 such that an image of a predetermined color can be displayed.

As described, the quantum dot sheet according to an exemplary embodiment of the present system and method includes a phosphor pattern printed at an edge portion of its one or more surfaces so that deterioration of color conversion performance due to oxidization occurring in the edge of the quantum dot sheet can be prevented.

While the present system and method have been described in connection with exemplary embodiments, it is understood that the present system and method are not limited to the disclosed embodiments.

<Description of Symbols>

10: quantum dot sheet
13, 15: quantum dot
17a, 17b: barrier film
20: light unit
75: liquid crystal panel
70: liquid crystal panel assembly
12: color conversion film
19: polymer layer
100: liquid crystal display
40: LED light source
50: light guide
60: top chassis <Description of Symbols>

22: molded frame
77: IC chip
24: optical sheet
28: bottom chassis
79: flexible circuit board
26: reflection sheet

What is claimed is:

1. A quantum dot sheet comprising:
a color conversion film that includes quantum dots and a polymer layer in which the quantum dots are dispersed;
a first barrier film that is provided on a first planar surface of the color conversion film;
a second barrier film that is provided on a second planar surface of the color conversion film opposite to the first planar surface; and
a phosphor pattern that is disposed along only an edge portion of an upper surface of the first barrier film and along only an edge portion of a lower surface of the second barrier film, thereby leaving a central portion of the upper surface of the first barrier film and a central portion of the lower surface of the second barrier film uncovered by a phosphor pattern,
wherein the upper surface of the first barrier film and the lower surface of the second barrier face opposite directions.

2. The quantum dot sheet of claim 1, wherein the first barrier film comprises at least one selected from a polyethylene terephthalate (PET) film, a polycarbonate (PC) film, and a co-polyethylene terephthalate (CoPET) film.

3. The quantum dot sheet of claim 2, wherein the quantum dot sheet and the first barrier film further include an inorganic oxide, wherein the inorganic oxide comprises at least one selected from silica, alumina, titania, and zirconia.

4. The quantum dot sheet of claim 1, wherein the phosphor pattern has a third portion that is formed on a side surface of the color conversion film and a side surface of the first and second barrier films.

5. The quantum dot sheet of claim 2, wherein the first barrier film has oxygen transmittance of about 0.01 $cm^3 \cdot mm/m^2 \cdot day \cdot atm$ to 0.5 $cm^3 \cdot mm/m^2 \cdot day \cdot atm$ and moisture transmittance of about 0.001 $g/m^2 \cdot day$ to 0.01 $g/m^2 \cdot day$.

6. The quantum dot sheet of claim 1, wherein the phosphor pattern comprises at least one selected from a yellow-based phosphor material, a green-based phosphor material, and a red-based phosphor material.

7. The quantum dot sheet of claim 6, wherein the phosphor pattern comprises a green-based phosphor material and a red-based phosphor material.

8. The quantum dot sheet of claim 6, wherein the yellow-based phosphor comprises at least one selected from a garnet-based phosphor, an oxide-based phosphor, and a nitride-based phosphor, and
the garnet-based phosphor is $(Y,Gd)_3Al_5O_{12}:Ce^{3+}$ or $Tb_3Al_5O_{12}:Ce^{3+}$ which is a yttrium aluminum garnet (YAG) or a terbium aluminum garnet (TAG),
the oxide-based phosphor is $(Sr,Ba,Ca,Mg)_2SiO_4:Eu^{2+}$, and
the nitride-based phosphor is $La_3Si_6N_{11}:Ce^{3+}$.

9. The quantum dot sheet of claim 6, wherein the green-based phosphor comprises at least one of an oxide-based phosphor, a sulfide-based phosphor, and a nitride-based phosphor, and
the oxide-based phosphor is $(Sr,Ba,Ca,Mg)_2SiO_4:Eu^{2+}$ or $(Sr,Ba,Ca,Mg)_3SiO_5:Eu^{2+}$,
the sulfide-based phosphor is $SrGa_2S_4$:Eu, and the nitride-based phosphor is (β-SiAlON:$Eu^{2+}$), (Sr,Ba)$Si_2O_2N_2$:$Eu^{2+}$, $(Ba,Sr,Ca)_2SiO_4$:$Eu^{2+}$, or $Ba_3Si_6O_{12}N_2$:$Eu^{2+}$.

10. The quantum dot sheet of claim 6, wherein the red-based phosphor comprises a nitride-based phosphor selected from (Sr,Ca)AlSiN$_3$:$Eu^{2+}$ and $(Ba,Sr,Ca)_2Si_5N_8$:$Eu^{2+}$.

11. A light unit comprising:
a light emitting diode (LED) light source;
a quantum dot sheet provided at a distance from the LED light source, the quantum dot sheet converts light from the LED light source to white light and emits the white light to a liquid crystal panel; and
a light guide provided between the LED light source and the quantum dot sheet, wherein the quantum dot sheet comprises:
a color conversion film that includes quantum dots and a polymer layer in which the quantum dots are dispersed;
a first barrier film that is provided on a first planar surface of the color conversion film; and
a phosphor pattern that is disposed along only an edge portion of a surface of the first barrier film, thereby leaving a central portion of the surface of the first barrier film uncovered by the phosphor pattern.

12. The light unit of claim 11, further comprising a second barrier film that is formed on a second planar surface of the color conversion film opposite to the first planar surface, wherein the phosphor pattern has a second portion that is formed along an edge portion of a surface of the second barrier film.

13. The light unit of claim 11, wherein the phosphor pattern comprises at least one selected from a yellow-based phosphor material, a green-based phosphor material, and a red-based phosphor material.

14. The light unit of claim 13, wherein the yellow-based phosphor comprises at least one selected from a garnet-based phosphor, an oxide-based phosphor, and a nitride-based phosphor, and
the garnet-based phosphor is $(Y,Gd)_3Al_5O_{12}$:$Ce^{3+}$ or $Tb_3Al_5O_{12}$:$Ce^{3+}$ which is yttrium aluminum garnet (YAG) or a terbium aluminum garnet (TAG),
the oxide-based phosphor is $(Sr,Ba,Ca,Mg)_2SiO_4$:$Eu^{2+}$, and
the nitride-based phosphor is $La_3Si_6N_{11}$:$Ce^{3+}$.

15. The light unit of claim 13, wherein the green-based phosphor comprises at least one of an oxide-based phosphor, a sulfide-based phosphor, and a nitride-based phosphor, and
the oxide-based phosphor is $(Sr,Ba,Ca,Mg)_2SiO_4$:$Eu^{2+}$ or $(Sr,Ba,Ca,Mg)_3SiO_5$:$Eu^{2+}$,
the sulfide-based phosphor is $SrGa_2S_4$:Eu, and
the nitride-based phosphor is (β-SiAlON:$Eu^{2+}$), (Sr,Ba)$Si_2O_2N_2$:$Eu^{2+}$, $(Ba,Sr,Ca)_2SiO_4$:$Eu^{2+}$, or $Ba_3Si_6O_{12}N_2$:$Eu^{2+}$.

16. The light unit of claim 13, wherein the red-based phosphor comprises a nitride-based phosphor selected from (Sr,Ca)AlSiN$_3$:$Eu^{2+}$ and $(Ba,Sr,Ca)_2Si_5N_8$:$Eu^{2+}$.

17. The light unit of claim 11, wherein the quantum dot sheet is provided on at least two selected from a light guide, a prism sheet, and a luminance enhancement film.

18. A liquid crystal display comprising:
a liquid crystal display panel that includes an upper polarizer and a lower polarizer respectively attached to an upper portion and a lower portion thereof; and
a light unit that provides light to the lower portion of the liquid crystal display panel,
wherein the light unit comprises:
an LED light source;
a quantum dot sheet provided at a distance from the LED light source, the quantum dot sheet converts light from the LED light source to white light and emits the white light to a liquid crystal panel; and
a light guide panel provided between the LED light source and the quantum dot sheet, and
the quantum dot sheet comprises:
a color conversion film that includes quantum dots and a polymer layer in which the quantum dots are dispersed;
a barrier film that is provided on a planar surface of the color conversion film; and
a phosphor pattern formed at only an edge portion of a surface of the barrier film, thereby leaving a central portion of the surface of the barrier film uncovered by the phosphor pattern.

19. The liquid crystal display of claim 18, wherein the phosphor pattern comprises at least one selected from a yellow-based phosphor material, a green-based phosphor material, and a red-based phosphor material.

* * * * *